United States Patent
Sekine et al.

(10) Patent No.: US 9,263,283 B2
(45) Date of Patent: Feb. 16, 2016

(54) ETCHING METHOD AND APPARATUS

(71) Applicant: TOKYO ELECTRON LIMITED, Tokyo (JP)

(72) Inventors: Takayuki Sekine, Miyagi (JP); Masaru Sasaki, Miyagi (JP); Naoki Matsumoto, Miyagi (JP); Eiichirou Shinpuku, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/227,972

(22) PCT Filed: Sep. 25, 2012

(86) PCT No.: PCT/JP2012/074468
§ 371 (c)(1),
(2) Date: Mar. 27, 2014

(87) PCT Pub. No.: WO2013/047464
PCT Pub. Date: Apr. 4, 2013

(65) Prior Publication Data
US 2014/0302684 A1    Oct. 9, 2014

(30) Foreign Application Priority Data
Sep. 28, 2011   (JP) ................. 2011-212450

(51) Int. Cl.
*H01J 37/32* (2006.01)
*H01L 21/302* (2006.01)
*H01L 21/461* (2006.01)
*H01L 21/3065* (2006.01)
(Continued)

(52) U.S. Cl.
CPC ......... *H01L 21/3065* (2013.01); *H01J 37/3222* (2013.01); *H01J 37/3244* (2013.01); *H01J 37/32192* (2013.01); *H01L 21/0337* (2013.01); *H01L 21/31116* (2013.01); *H01L 21/31144* (2013.01); *H01L 21/67069* (2013.01)

(58) Field of Classification Search
None
See application file for complete search history.

(56) References Cited

U.S. PATENT DOCUMENTS 7,601,647 B2   10/2009  Jeon et al.
2004/0094094 A1  5/2004  Ohmi et al.
(Continued)

FOREIGN PATENT DOCUMENTS

JP   2002-299240 A   10/2002
JP   2008-193098 A    8/2008
(Continued)

OTHER PUBLICATIONS

International Search Report mailed Nov. 20, 2012 in PCT/JP2012/074468.

*Primary Examiner* — Allan Olsen
*Assistant Examiner* — Margaret D Klunk
(74) *Attorney, Agent, or Firm* — Rothwell, Figg, Ernst & Manbeck, P.C.

(57) ABSTRACT

An etching method and apparatus for etching a silicon oxide film selectively with respect to a silicon nitride film formed on a substrate are provided. A processing gas containing a plasma excitation gas and a CHF-based gas is introduced into a processing chamber such that a flow rate ratio of the CHF-based gas to the plasma excitation gas is 1/15 or higher. By generating a plasma in the processing chamber, the silicon oxide film is etched selectively with respect to the silicon nitride film formed on the substrate in the processing chamber.

5 Claims, 6 Drawing Sheets

STEP IN FIG.1C

STEP IN FIG.1D

(51) Int. Cl.
*H01L 21/311* (2006.01)
*H01L 21/67* (2006.01)
*H01L 21/033* (2006.01)

(56) References Cited

U.S. PATENT DOCUMENTS

2007/0190792 A1* 8/2007 Cook .......................... 438/706
2008/0188083 A1 8/2008 Jeon et al.
2011/0017586 A1 1/2011 Nakamura et al.
2011/0039355 A1* 2/2011 Zhao et al. ..................... 438/9
2013/0023120 A1* 1/2013 Yaegashi et al. .............. 438/689

FOREIGN PATENT DOCUMENTS

| JP | 4733214 | B1 | 7/2011 |
| TW | 399267 | B | 7/2000 |
| TW | 200941579 | A1 | 10/2009 |
| TW | 201131648 | A1 | 9/2011 |

* cited by examiner

STEP IN FIG.1C

STEP IN FIG.1D

ETCHING METHOD AND APPARATUS

CROSS REFERENCE TO RELATED APPLICATIONS

This application is a Continuation application of PCT International Application No. PCT/JP2012/074468 filed on Sep. 25, 2012, which designated the United States, which claims priority to and the benefit of Japanese Patent Application No. 2011-212450 filed Sep. 28, 2011, the disclosures of which are incorporated herein by reference in their entireties.

FIELD OF THE INVENTION

The present invention relates to a method and apparatus for selectively etching a silicon oxide film with respect to a silicon nitride film formed on a substrate.

BACKGROUND OF THE INVENTION

Semiconductor integrated circuits have been developed to have high performance and high integration in response to miniaturization of devices. In recent years, miniaturization is being advanced in the device design rules, but optical lithography that is a main technique of miniaturization is approaching the practical limit.

In order to obtain highly miniaturized patterns, it is necessary to reduce a pitch of a pattern, which is the sum of the width of the pattern and the interval between adjacent patterns. It is relatively easy to narrow the width of the pattern by exposure. However, it is relatively difficult to form fine patterns at a short pitch. In the optical lithography, it is a challenge to shorten the pitch when the fine patterns are formed.

As a technique for forming fine patterns at a short pitch, a technique called double patterning has been developed (see, e.g., Patent Document 1). Double patterning is a technique for forming two patterns in one pitch to double the pattern as the name implies.

Patent Document 1: Japanese Patent Application Publication No. 2008-193098

In the double patterning technology, a step of etching a silicon oxide film formed on a silicon nitride film is required. In this case, it is requested to suppress a recess from being formed in the silicon nitride film by increasing the selectivity of the silicon oxide film with respect to the silicon nitride film.

However, the binding energy of Si—O is 111 eV, and is higher than the binding energy of Si—N which is 105 eV. Thus, in a state in which both the silicon oxide film and the silicon nitride film are present, it is physically difficult to increase the selectivity of the silicon oxide film with respect to the silicon nitride film. This is because the silicon nitride film is also etched when the silicon oxide film is etched by increasing the ion energy of the plasma. Therefore, not only a physical approach such as increasing the ion energy of the plasma, but also a chemical approach using a difference in reactivity between the surfaces of the silicon oxide film and the silicon nitride film is necessary.

SUMMARY OF THE INVENTION

In view of the above, the present invention provides a novel etching method and apparatus capable of increasing selectivity of a silicon oxide film with respect to a silicon nitride film.

In order to solve the aforementioned problem, in accordance with an aspect of the present invention, there is provided an etching method of etching a silicon oxide film selectively with respect to a silicon nitride film formed on a substrate, the etching method including: introducing a processing gas containing a plasma excitation gas and a CHF-based gas into a processing chamber such that a flow rate ratio of the CHF-based gas to the plasma excitation gas is 1/15 or higher; and etching the silicon oxide film selectively with respect to the silicon nitride film formed on the substrate in the processing chamber by generating a plasma in the processing chamber.

In accordance with another aspect of the present invention, there is provided an apparatus for etching a silicon oxide film selectively with respect to a silicon nitride film formed on a substrate, wherein: a processing gas containing a plasma excitation gas and a CHF-based gas is introduced into a processing chamber such that a flow rate ratio of the CHF-based gas to the plasma excitation gas is 1/15 or higher; and the silicon oxide film is etched selectively with respect to the silicon nitride film formed on the substrate in the processing chamber by generating a plasma in the processing chamber.

When the flow rate ratio of the CHF-based gas to the plasma excitation gas is increased to 1/15 or higher, the amount of carbon and the amount of fluorine in the plasma increase. Since the amount of fluorine contributing to etching increases, it is possible to increase the etching rate of the silicon oxide film. Meanwhile, since the surface of the silicon nitride film is more chemically unstable than the surface of the silicon oxide film, carbon-based deposits are deposited on the surface of the silicon nitride film. Thus, even if the amount of fluorine contributing to etching increases, the etching rate of the silicon nitride film does not increase as much as that of the silicon oxide film. Therefore, it is possible to increase the selectivity of the silicon oxide film with respect to the silicon nitride film.

Further, by using a CHF-based gas as an etching gas, it is possible to control the etching rates of the silicon oxide film and the silicon nitride film.

DETAILED DESCRIPTION OF THE EMBODIMENTS

Figure 1A:
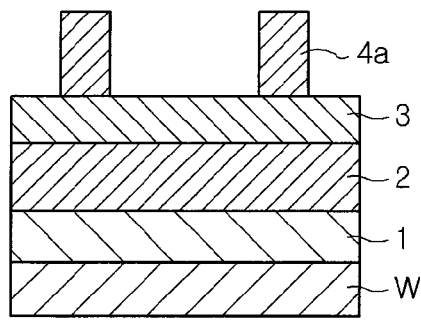
FIGS. 1A to 1F are diagrams showing steps of double patterning to which an etching method in accordance with a first embodiment of the present invention is applied.

Hereinafter, an etching method in accordance with a first embodiment of the present invention will be described with reference to the accompanying drawings. Throughout the drawings, the same reference numerals are given to the same components.

The steps of double patterning to which the etching method of the first embodiment is applied are shown in FIGS. 1A to 1F.

As shown in FIG. 1A, a silicon nitride film 1, a polysilicon film 2 and a bottom anti-reflection coating (BARC) film 3 are sequentially stacked on a wafer (substrate) W made of silicon or the like. The silicon nitride film 1 and the polysilicon film 2 are formed by, e.g., a chemical vapor deposition (CVD) method. An ArF photoresist is coated on a surface of the BARC film 3. A mask pattern is transferred to the photoresist layer by exposure. The exposed photoresist layer is developed. After development, resist patterns 4a are formed on the upper surface of the BARC film 3. The resist patterns 4a include, e.g., line/space patterns.

The polysilicon film 2 is etched using the resist patterns 4a as a mask. As shown in FIG. 1B, polysilicon film patterns 2a are formed in the same patterns as the resist patterns 4a. In this case, the polysilicon film patterns 2a are formed such that a ratio of a line width to an interval between adjacent lines is 1:3.

Figure 1D:
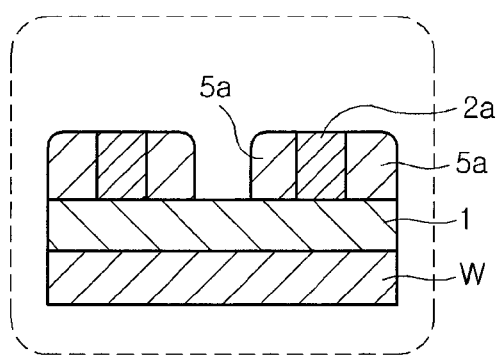
Figure 1B:
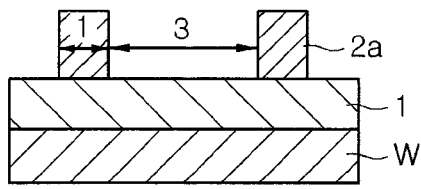
Figure 1E:
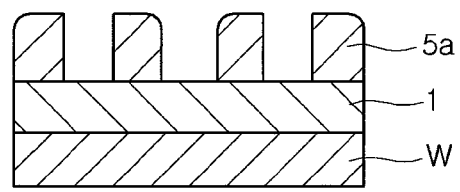
Figure 1C:
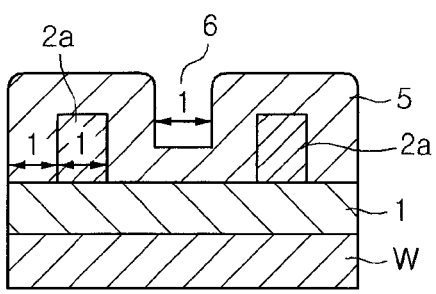
Figure 1F:
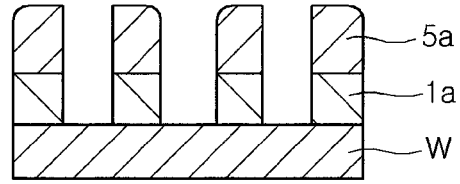

As shown in FIG. 1C, a silicon oxide film 5 having a conformal film thickness (uniform film thickness) is formed on the polysilicon film patterns 2a. The silicon oxide film is formed by, e.g., a chemical vapor deposition (CVD) method.

The silicon oxide film 5 is formed on the upper surfaces of the polysilicon film patterns 2a, the right and left sidewalls of the polysilicon film patterns 2a, and the upper surface of the silicon nitride film 1 between the polysilicon film patterns 2a. The thickness of the silicon oxide film 5 formed on the sidewalls of the polysilicon film patterns 2a is equal to the line width of the polysilicon film patterns 2a. Since the interval between the adjacent polysilicon film patterns 2a is three times the line width of the polysilicon film patterns 2a, a space 6 having the same width as that of the polysilicon film patterns 2a is provided between the portions of the silicon oxide film 5 formed on the sidewalls of the adjacent polysilicon film patterns 2a.

As shown in FIG. 1D, in order to form spacers 5a made of the silicon oxide film 5 on the sidewalls of the polysilicon film patterns 2a, the silicon oxide film 5 formed on the upper surfaces of the polysilicon film patterns 2a and the upper surface of the silicon nitride film 1 between the adjacent polysilicon film patterns 2a is etched anisotropically. The etching method of the first embodiment is applied to the etching step from FIG. 10 to FIG. 1D. The etching method of the first embodiment will be described in detail later.

As shown in FIG. 1E, the polysilicon film patterns 2a are only etched and removed. Then, the spacers 5a are formed twice the number of the resist patterns 4a, and the spacers 5a include line/space patterns. By etching the silicon nitride film 1 using the spacers 5a as a mask, silicon nitride film patterns 1a are formed (see FIG. 1F).

Figure 2:
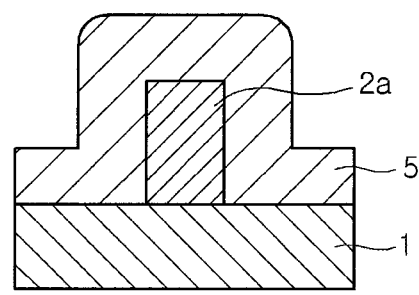
FIG. 2 is a diagram showing steps of the etching method of the first embodiment.
Figure 2:
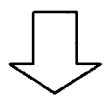
Figure 2:
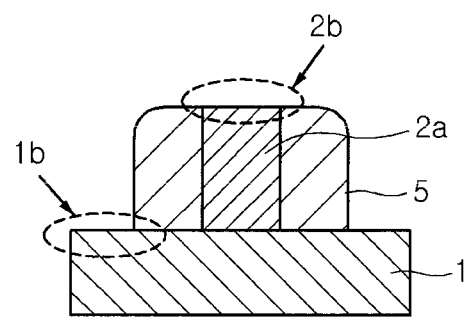

FIG. 2 shows the step (the etching step from FIG. 10 to FIG. 1D) of the etching method of the first embodiment. In the etching method, in order to form the spacers 5a made of the silicon oxide film 5 on the sidewalls of the polysilicon film patterns 2a, the silicon oxide film 5 formed on the upper surfaces of the polysilicon film patterns 2a and the upper surface of the silicon nitride film 1 between the polysilicon film patterns 2a is etched anisotropically. The etching method of the first embodiment is carried out in an etching apparatus having a radial line slot antenna.

A processing gas containing a plasma excitation gas and a CHF-based gas is introduced into a processing chamber of the etching apparatus having a radial line slot antenna. Then, by generating a plasma in the processing chamber, the silicon oxide film 5 is etched selectively with respect to the silicon nitride film 1.

The plasma generated in the etching apparatus having the radial line slot antenna is a diffusion plasma having a high density and a low electron temperature, and is characterized in that it is easy to control a dissociation state of the gas. Accordingly, etching may be performed while depositing a desired protective film mainly containing carbon and fluorine on the upper surface of the silicon nitride film 1 by appropriately dissociating the CHF-based gas.

As the plasma excitation gas, an inert gas, e.g., a gas containing at least one of Ar, He, Ne, Kr and Xe is used. In terms of cost, the use of Ar is desirable.

As the CHF-based gas, at least one gas selected from the group consisting of $CHF_3$ gas, $CH_2F_2$ gas and $CH_3F$ gas is used. When the CHF-based gas is dissociated, carbon-based deposits with C—C bonds or C—F bonds are formed on the surface of the wafer W. Further, fluorine contributes to etching. In the case of using the $CHF_3$ gas, the amount of fluorine increases, and the tendency of etching becomes stronger. In the case of using the $CH_3F$ gas, the amount of fluorine decreases, and the tendency of deposition is stronger than etching. Since the binding energy of the silicon oxide film 5 is relatively high, it is preferable to use the $CHF_3$ gas with the stronger tendency of etching. Further, in the case of using the CF-based gas, e.g., $CF_4$ gas, since etching is excessive due to an increase in the amount of fluorine generated by the dissociation, it is difficult to control an etching rate.

The flow rate ratio of the CHF-based gas to the plasma excitation gas is set to 1/15 or higher. Thus, as described below, the selectivity of the silicon oxide film 5 with respect to the silicon nitride film 1 can be 1 or higher.

An oxidizing gas, e.g., $O_2$ gas is added to the CHF-based gas. The $O_2$ gas is used to protect the spacers 5a formed on the sidewalls of the polysilicon film patterns 2a. The spacers 5a of the sidewalls of the polysilicon film patterns 2a are used as final mask patterns. By oxidizing the surface of the silicon oxide film 5 using active species of oxygen radicals derived from the $O_2$ gas, the etching resistance of the spacers 5a is enhanced. However, when the amount of $O_2$ gas is excessively large, the $O_2$ gas reacts with carbon-based deposits on the silicon nitride film 1 to become carbon monoxide to be removed. Therefore, the flow rate of the $O_2$ gas is set to 1/10 or less of the flow rate of CHF-based gas.

Tables 1 and 2 show examples of the processing conditions in the etching method of the first embodiment.

TABLE 1

| Processing gas | Ar: 450 sccm |
| --- | --- |
|  | $CHF_3$: 50 sccm |
|  | $O_2$: 2 sccm |
| Pressure | 50 mT |
| Microwave power | 2000 W |
| RF bias | 100 W |
| wafer temperature | 30° C. |
| Processing time | 8 seconds |
| RDC | 7% |

TABLE 2

| Processing gas | Ar: 450 sccm |
| --- | --- |
|  | $CHF_3$: 30 sccm |
|  | $O_2$: 2 sccm |
| Pressure | 20 mT |
| Microwave power | 2000 W |
| RF bias | 100 W |
| wafer temperature | 30° C. |
| Processing time | 16 seconds |
| RDC | 7% |

The RDC in Tables 1 and 2 is Radical Distribution Control, i.e., (amount of gas introduced to the center portion of the wafer)/(amount of gas introduced to the center portion of the wafer+amount of gas introduced to the edge portion of the wafer).

The etching is stopped when the upper surfaces 2b of the polysilicon film patterns 2a and the upper surface 1b of the silicon nitride film 1 are exposed by completing the etching of the silicon oxide film 5 on the upper surfaces of the polysilicon film patterns 2a and the upper surface of the silicon nitride film 1. When the selectivity of the silicon oxide film 5 with respect to the silicon nitride film 1 (etching rate of the silicon oxide film 5/etching rate of the silicon nitride film 1) is 1 or higher, it is possible to suppress recesses from being formed on the upper surface 1b of the silicon nitride film 1 even if the silicon oxide film 5 is over-etched. Further, when the selectivity is 1 or higher, it is possible to reduce the number of recesses formed on the upper surface 1b of the silicon nitride film 1 in the center portion of the wafer W even if etching is performed in the center portion of the wafer W faster than the edge portion of the wafer W. Further, the allowable depth of the recess (depression caused by etching the upper surface 1b of the silicon nitride film 1) is 4 nm or less.

As shown in FIG. 1E, after etching of the silicon oxide film 5, the polysilicon film patterns 2a are removed by etching. Thus, the selectivity of the silicon oxide film 5 with respect to polysilicon needs not be high as much as the selectivity of the silicon oxide film 5 with respect to the silicon nitride film 1.

Figure 3:
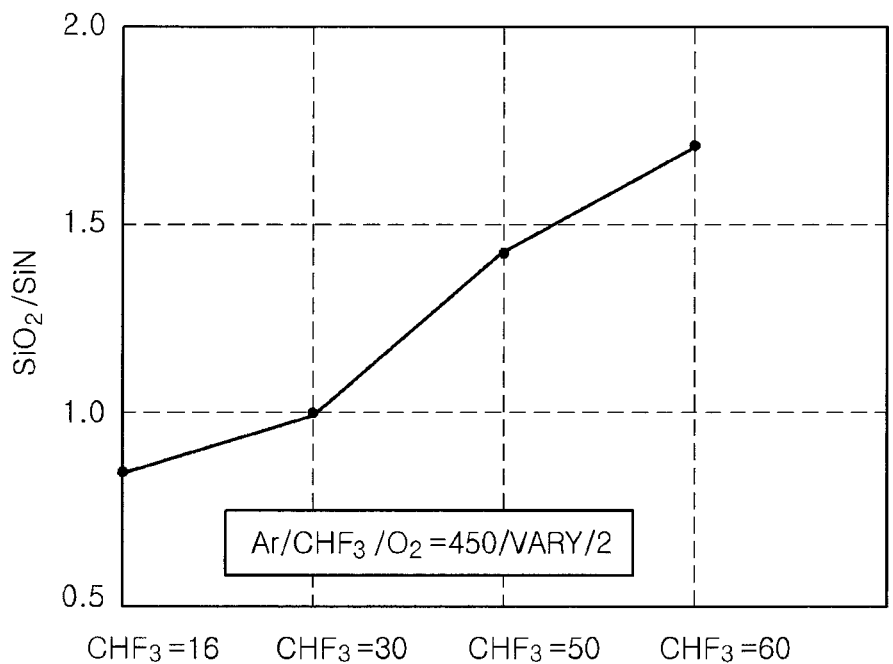
FIG. 3 shows experimental results of the selectivity of a silicon oxide film under different flow rates of $CFH_3$ gas.

FIG. 3 shows experimental results obtained by varying the flow rate ratio of the $CHF_3$ gas to the Ar gas. As the conditions other than the flow rate of the $CHF_3$ gas, the conditions of Table 2 were used. The horizontal axis shown in FIG. 3 indicates the flow rate of the $CHF_3$ gas. Here, the flow rate of the $CHF_3$ gas was only varied while keeping the flow rate of the Ar gas and the flow rate of the $O_2$ gas constant. Specifically, the flow rate of the Ar gas was set to 450 sccm, the flow rate of the $O_2$ gas was set to 2 sccm, and the flow rate of the $CHF_3$ gas was only varied in a range from 16 sccm to 60 sccm.

Figure 4:
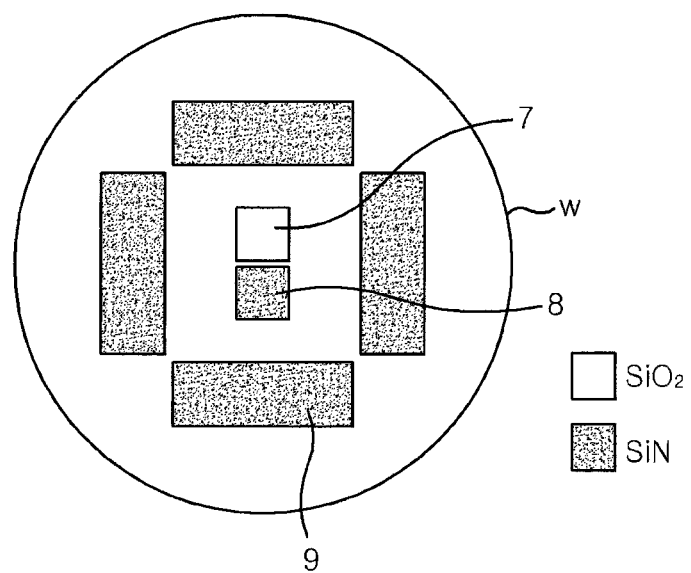
FIG. 4 is a plan view showing a chip of a silicon oxide film and a chip of a silicon nitride film disposed on a wafer.

The vertical axis shown in FIG. 3 indicates the selectivity of the silicon oxide film 5 with respect to the silicon nitride film 1. In obtaining the selectivity, the etching rates of the silicon oxide film and the silicon nitride film were measured quantitatively. As shown in FIG. 4, after a chip 7 having the silicon oxide film thereon and a chip 8 having the silicon nitride film thereon were arranged on the wafer W, the etching rates of the two chips and 8 were measured by simultaneously etching the two chips 7 and 8. As shown in FIG. 1D, when the spacers 5a are formed by etching the silicon oxide film 5, the silicon nitride film 1 having an area of about 1/4 of the surface area of the wafer W is exposed on the wafer W. In order to make the same environment when etching the spacers 5a, rectangular chips 9 on which the silicon nitride film having an area of about 1/4 of the surface area of the wafer W is correspondingly formed were added onto the wafer W.

As shown in FIG. 3, as the flow rate of the $CHF_3$ gas increases, the selectivity of the silicon oxide film 5 with respect to the silicon nitride film 1 increases. The reason is as follows. When the flow rate of the $CHF_3$ gas increases, the amount of carbon and the amount of fluorine dissociated by the plasma increase. Since the amount of fluorine contributing to etching increases, the etching rate of the silicon oxide film 5 increases. Meanwhile, since the surface of the silicon nitride film 1 is more chemically unstable than the surface of the silicon oxide film, carbon-based deposits are likely to be deposited on the surface of the silicon nitride film 1. Thus, since the surface of the silicon nitride film 1 is protected by carbon-based deposits even if the amount of fluorine contributing to etching increases, the etching rate of the silicon nitride film 1 does not increase as much as the etching rate of the silicon oxide film 5. Accordingly, the selectivity of the silicon oxide film 5 with respect to the silicon nitride film 1 increases.

When the flow rate of the $CHF_3$ gas becomes 30 sccm or more (when the flow rate ratio of the $CHF_3$ gas to the Ar gas is 1/15 or higher), the selectivity becomes 1 or higher. When the flow rate of the $CHF_3$ gas becomes 50 sccm (when the flow rate ratio of the $CHF_3$ gas to the Ar gas is 1/9), the selectivity is about 1.4. When the flow rate of the $CHF_3$ gas becomes 60 sccm (when the flow rate ratio of the $CHF_3$ gas to the Ar gas is 2/15), the selectivity reaches the maximum, which is about 1.8. When the flow rate of the $CHF_3$ gas exceeds 60 sccm (i.e., when the flow rate ratio of the $CHF_3$ gas to the Ar gas exceeds 2/15), the selectivity becomes lower than 1.8. It is assumed that this is because the etching rates of both the silicon oxide film 5 and the silicon nitride film 1 decrease due to carbon-based deposits, or the etching rate of the silicon nitride film 1 increases at an accelerating rate due to radical excess.

The higher the flow rate ratio of the $CHF_3$ gas to the Ar gas, the higher the selectivity, but both the etching rates of the silicon oxide film 5 and the silicon nitride film 1 become larger. When the etching rate is large, it is difficult to control the etching amount. Accordingly, it becomes necessary to shorten the time for over-etching the silicon oxide film 5, which results in a reduction of the process margin. Therefore, it is preferable to make the flow rate of the $CHF_3$ gas equal to or less than 90 sccm (make the flow rate ratio of the $CHF_3$ gas to the Ar gas equal to or less than 3/15).

As a result of comparing the sizes of the recesses formed in the silicon nitride film 1 when the gas flow rates of Ar/$CHF_3$/$O_2$ were set to 450/16/2 (sccm) and when they were set to 450/60/2 (sccm), it was found that the size of the recess of the silicon nitride film 1 was reduced to half by increasing the flow rate of the $CHF_3$ gas. This is because the carbon-based deposits were deposited on the surface of the silicon nitride film 1 to protect the silicon nitride film 1.

Further, from a state where the flow rate of the Ar gas was 450 sccm and the flow rate of the $CHF_3$ gas was 60 sccm, the flow rate of the Ar gas was reduced to 200 sccm from 450 sccm and the flow rate of the $CHF_3$ gas was reduced to 30 sccm from 60 sccm while maintaining the flow rate ratio of the $CHF_3$ gas to the Ar gas substantially constant. As a result, the selectivity was lowered. The same was true when the flow rates were reduced to 1/2 from a state where the flow rate of the Ar gas was 450 sccm and the flow rate of the $CHF_3$ gas was 50 sccm. It is assumed that this is because the $CHF_3$ gas was dissociated while lowering the flow rate of the Ar gas, and the protective film of carbon-based deposits was not sufficiently formed. Therefore, it is preferably that the flow rate of the Ar gas is equal to or more than 200 sccm.

Then, the bias dependence of the selectivity was experimented by changing the RF bias to 100 W, 90 W, 80 W and then 70 W using the etching conditions shown in Table 2. As the RF bias was lowered to 100 W, 90 W and 80 W, the size of the recess formed in the silicon nitride film 1 was reduced gradually. Further, when the RF bias was lowered to 70 W, it was possible to substantially eliminate the recess formed in the silicon nitride film 1. However, when the RF bias is lowered to be less than 70 W, the etching rate of the silicon oxide film 5 is reduced. In order to ensure the etching rate of the silicon oxide film 5, it is desirable to make the RF bias equal to or higher than 70 W.

Although the etching apparatus having the radial line slot antenna is used in the above-described etching method, other etching apparatuses capable of generating a plasma may also be used. The etching apparatus having the radial line slot antenna has the following configuration.

Figure 5:
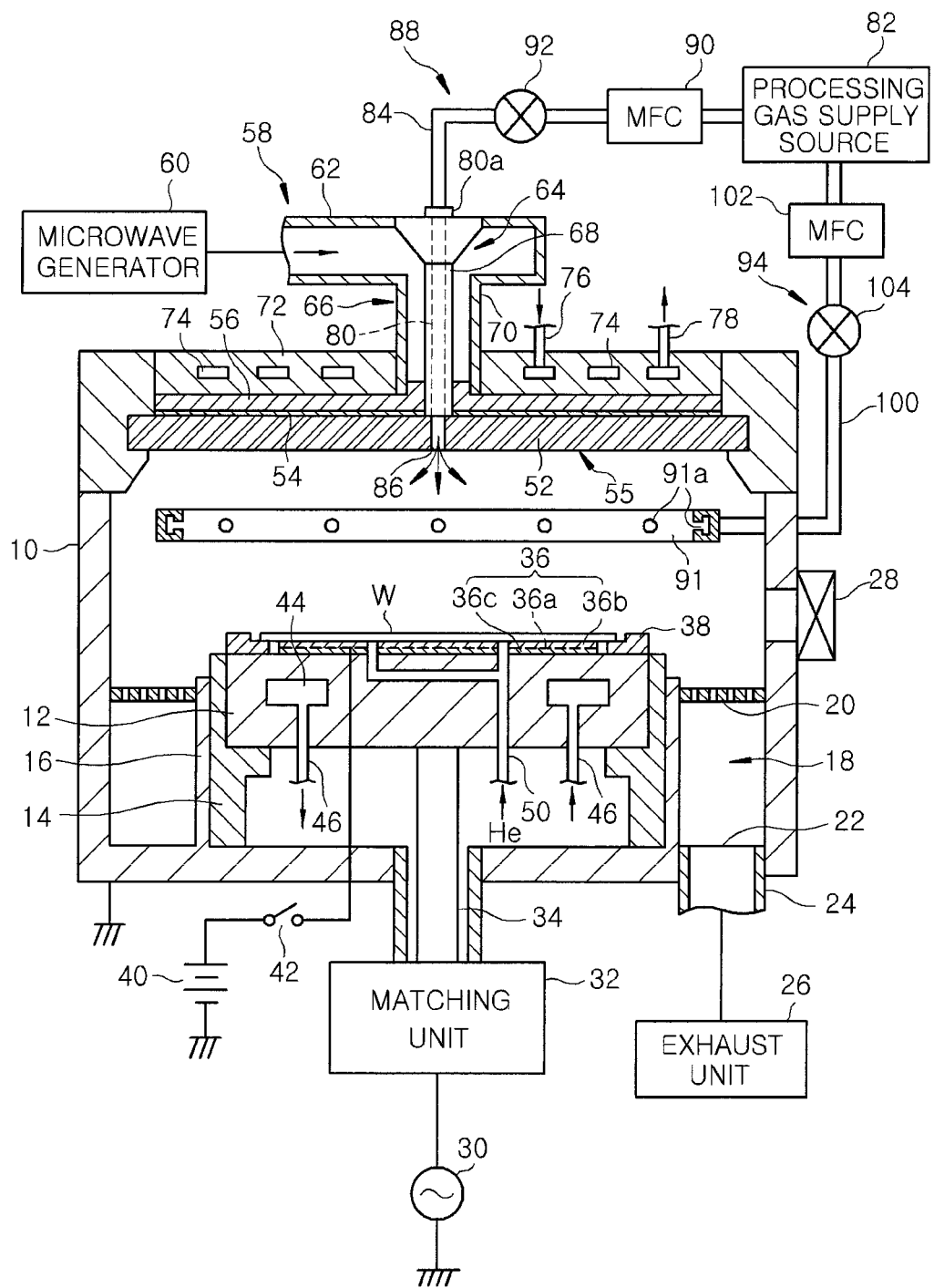
FIG. 5 shows a schematic cross-sectional view of an etching apparatus having a radial line slot antenna.

FIG. 5 shows a schematic cross-sectional view of the etching apparatus having the radial line slot antenna. The etching apparatus having the radial line slot antenna utilizes microwaves radiated from the slot antenna in order to excite the plasma. The plasma generated in this way is called a surface wave plasma. When using the surface wave plasma, a plasma with a low electron temperature and high density may be generated in a region where an etching process is performed. The etching apparatus having the radial line slot antenna is characterized in that it is possible to generate a plasma with a low electron temperature and high density in a region where an etching process is performed.

Figure 7:
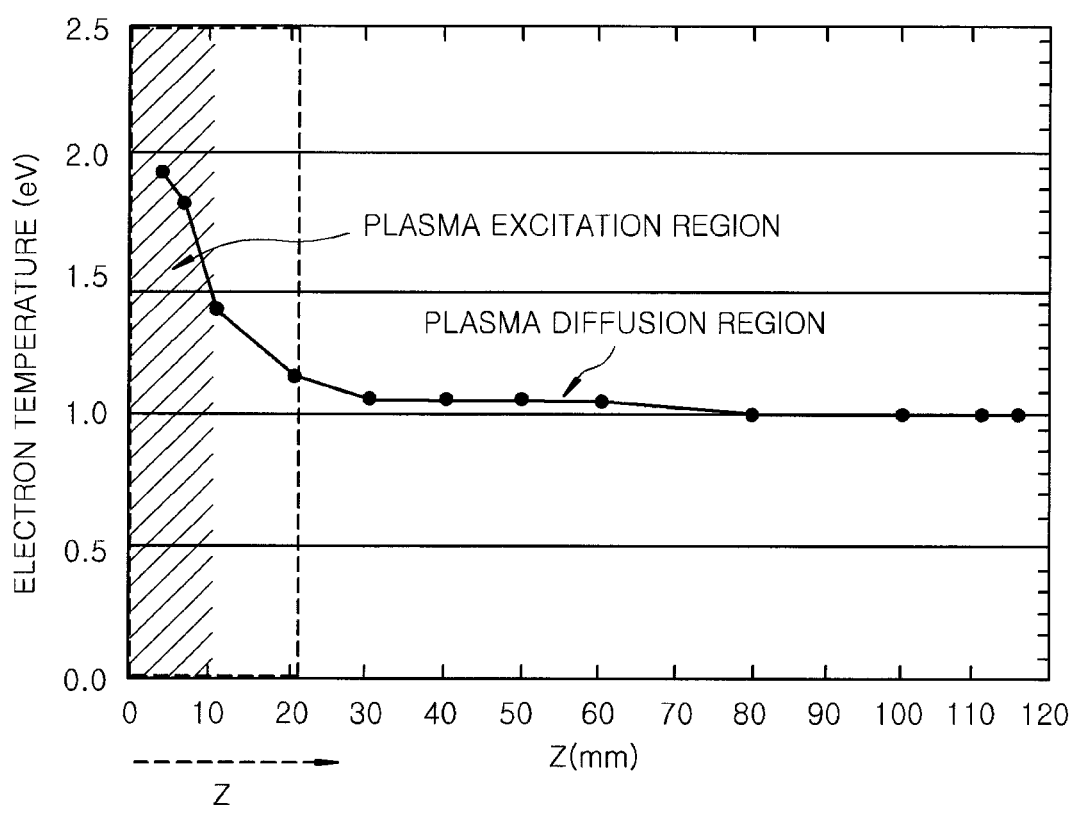
FIG. 7 is a graph showing a relationship between the electron temperature and the distance from a dielectric window of the etching apparatus having the radial line slot antenna.

As shown in FIGS. 5 and 7, when microwaves are introduced through a dielectric window 52 installed at an upper portion of a processing chamber 10, a high-density plasma is excited in a region directly below the dielectric window 52. The plasma in the plasma excitation region has a high density and a relatively high electron temperature, but since the plasma is diffused to the region where the etching process is performed from the plasma generation region, the electron temperature is lowered. Further, the electron density is also lowered by such diffusion, but since the plasma in the plasma excitation region has a high density, a sufficiently high density may be maintained in the plasma diffusion region. Through a gas injection port 86 provided in the center of the dielectric window 52 (corresponding to the center portion of the wafer), the etching gas may be supplied to the plasma excitation region having a relatively high electron temperature. Further, through a gas ring 91 below the dielectric window 52 (corresponding to edge portion of the wafer), the etching gas may be supplied to the plasma diffusion region having a relatively low electron temperature. With such configuration, the dissociation of the CHF-based gas can be controlled by controlling the flow rate of the CHF-based gas supplied to each region, thereby effectively depositing the deposits on a wafer W while maintaining C—C bonds or C—F bonds.

The etching apparatus having the radial line slot antenna includes the processing chamber 10 of a cylindrical shape, which is made of aluminum, stainless steel or the like. The processing chamber 10 is frame-grounded.

First, there will be described components or members which do not contribute directly to a generation of the microwave-excited plasma in the processing chamber 10 of the etching apparatus having the radial line slot antenna.

In the center of the bottom of the processing chamber 10, a mounting table 12 for mounting thereon the wafer W is provided. The mounting table 12 is supported by a cylindrical support 14 extending upward from the bottom of the processing chamber 10. The mounting table 12 is made of an insulating material such as alumina and aluminum nitride, and formed in a disk shape. In the mounting table 12, there is provided a lower electrode to which radio frequency waves are applied.

An annular exhaust path 18 is provided between the inner surface of the processing chamber 10 and a cylindrical wall portion 16, which surrounds the cylindrical support 14 and extends upward from the bottom of the processing chamber 10. An annular baffle plate 20 is disposed in an upper portion of the exhaust path 18, and exhaust ports 22 are provided in a lower portion of the exhaust path 18. In order to obtain a uniform flow of gas distributed symmetrically with respect to the wafer W on the mounting table 12, a plurality of the exhaust ports 22 are provided at equal angular intervals in a circumferential direction of the annular exhaust path 18. Each of the exhaust ports 22 is connected to an exhaust unit 26 through an exhaust pipe 24. The exhaust unit 26 includes a vacuum pump such as a turbo-molecular vacuum pump (TMP), which evacuates the processing chamber 10 to a desired vacuum pressure. A gate valve 28 opens and closes a transfer port through which the wafer W is loaded into or unloaded from the processing chamber 10.

The mounting table 12 is electrically connected to a radio frequency power supply 30 for applying an RF bias voltage to the mounting table 12 via a matching unit 32 and a power feeding rod 34. The radio frequency power supply 30 outputs radio frequency waves having a relatively low frequency of, e.g., 13.56 MHz at a predetermined power level. Such a low frequency is suitable for adjusting the energy of ions which are attracted to the wafer W on the mounting table 12. The matching unit 32 has a blocking capacitor for generating a self bias.

An electrostatic chuck 36 is disposed on the upper surface of the mounting table 12. The electrostatic chuck holds the wafer W on the mounting table 12 by an electrostatic force. The electrostatic chuck 36 includes an electrode 36a formed of a conductive film and a pair of insulating films 36b and 36c between which the electrode 36a is sandwiched. A DC power supply 40 is electrically connected to the electrode 36a via a switch 42. A DC voltage applied to the electrostatic chuck 36 from the DC power supply 40 causes a Coulomb force for holding the wafer W onto the electrostatic chuck 36. On the outer periphery of the electrostatic chuck 36, a focus ring 38 is provided to surround the wafer W.

A coolant path 44 is provided inside the mounting table 12. The coolant path 44 extends in a circumferential direction to form an annular shape. A coolant or cooling water of a predetermined temperature is supplied to the coolant path 44 through conduits 46 from a chiller unit (not shown) to circulate through the coolant path 44 and the conduits 46. By adjusting the temperature of the coolant, it is possible to adjust the temperature of the wafer W on the electrostatic chuck 36. In addition, a heat transfer gas such as He gas is supplied between the wafer W and the electrostatic chuck through a supply pipe 50 from a gas supply unit (not shown).

Next, there will be described components or members which contribute directly to the generation of the microwave plasma in the processing chamber 10 of the etching apparatus having the radial line slot antenna.

A planar antenna 55 includes the dielectric window 52 of a disk shape, which is made of a dielectric material such as quartz, ceramic, alumina ($Al_2O_3$) and aluminum nitride (AlN), and a slot antenna plate 54 of a disk shape. The dielectric window 52 is attached to the processing chamber 10 so as to seal the interior of the processing chamber 10, and functions as a ceiling portion of the processing chamber 10 opposite to the mounting table 12. The slot antenna plate 54 is disposed on the upper surface of the dielectric window 52, and has slots which are distributed concentrically. The slot antenna plate 54 is electromagnetically connected to a microwave transmission line 58 through a dielectric plate 56 made of a dielectric material such as quartz, ceramic, alumina ($Al_2O_3$) and aluminum nitride (AlN). The dielectric plate 56 reduces the wavelength of the microwaves that propagate therethrough.

The microwave transmission line 58 has a waveguide 62, a waveguide/coaxial pipe converter 64 and a coaxial pipe 66, and transmits the microwaves outputted from a microwave generator 60 to the slot antenna plate 54. The waveguide 62 is formed of, e.g., a rectangular pipe, and transmits the microwaves in a TE mode from the microwave generator 60 to the converter 64.

The converter 64 connects the waveguide 62 with the coaxial pipe 66, and converts the TE mode microwaves propagating in the waveguide 62 into TEM mode microwaves propagating in the coaxial pipe 66. The converter 64 is formed in a shape of a cone which is tapered downward. The upper portion of the converter 64 is coupled to the waveguide 62, and the lower portion of the converter 64 is coupled to an inner conductor 68 of the coaxial pipe 66.

The coaxial pipe 66 extends vertically downward toward the top center of the processing chamber 10 from the converter 64 to be connected to the slot antenna plate 54. The coaxial pipe 66 has an outer conductor 70 and the inner conductor 68. The outer conductor 70 is connected with the waveguide 62 at its upper end, and extends vertically downward to be coupled to the dielectric plate 56. The inner conductor 68 is connected with the converter 64 at its upper end and extends vertically downward so as to reach the slot antenna plate 54. The microwaves in the TEM mode propagate in between the outer conductor 70 and the inner conductor 68.

The microwaves outputted from the microwave generator 60 are transmitted through the microwave transmission line including the waveguide 62, the converter 64, and the coaxial pipe 66, and are supplied to the slot antenna plate after passing through the dielectric plate 56. The microwaves are spread in a radial direction in the dielectric plate 56 and radiated into the processing chamber 10 through the slots of the slot antenna plate 54. As a result, the gas directly below the dielectric window 52 is excited, and the plasma is generated in the processing chamber 10.

An antenna back plate 72 is provided on the upper surface of the dielectric plate 56. The antenna back plate 72 is made of, for example, aluminum. In the antenna back plate 72, a channel 74 which is connected to the chiller unit (not shown) is formed. A coolant or cooling water of a predetermined temperature is circulated through the channel 74 and pipes 76 and 78. The antenna back plate 72 serves as a cooling jacket for absorbing heat generated in the dielectric plate 56 and the like to transfer the heat to the outside.

In this embodiment, a gas introduction path 80 is provided so as to pass through the inner conductor 68 of the coaxial pipe 66. A first gas inlet pipe 84 is connected at one end to an upper opening 80a of the gas introduction path 80, and at the other end to a processing gas supply source 82. In the center of the dielectric window 52, the gas injection port 86 which is open to the processing chamber 10 is formed. In a first gas inlet 88 having the configuration described above, the processing gas from the processing gas supply source 82 flows through the first gas inlet pipe 84 and the gas introduction path 80 in the inner conductor 68, and is injected from the gas injection port 86 toward the mounting table 12 located below the gas injection port 86. The processing gas is drawn into the annular exhaust path 18 surrounding the mounting table 12 by the exhaust unit 26. A mass flow controller (MFC) 90 and an on-off valve 92 are provided in the first gas inlet pipe 84.

In this embodiment, in addition to the first gas inlet 88, a second gas inlet 94 is provided to supply the processing gas into the processing chamber 10. The second gas inlet 94 includes the gas ring 91 disposed in the processing chamber 10, and a gas supply pipe 100 connected to the gas ring 91. The gas ring 91 is formed in a hollow ring shape, and side injection ports 91a are provided at equal angular intervals in the circumferential direction on the inner circumferential side surface. The side injection ports 91a are open in the plasma region in the processing chamber 10. The gas supply pipe 100 is connected to the gas ring 91 and the processing gas supply source 82. A mass flow controller (MFC) 102 and an on-off valve 104 are provided in the gas supply pipe 100.

In the second gas inlet 94, the processing gas from the processing gas supply source 82 is introduced into the gas ring 91 through the gas supply pipe 100. The internal pressure of the gas ring 91 filled with the processing gas becomes uniform along the circumferential direction, and the processing gas is injected uniformly and horizontally in the plasma region of the processing chamber 10 from the side injection ports 91a.

Figure 6:
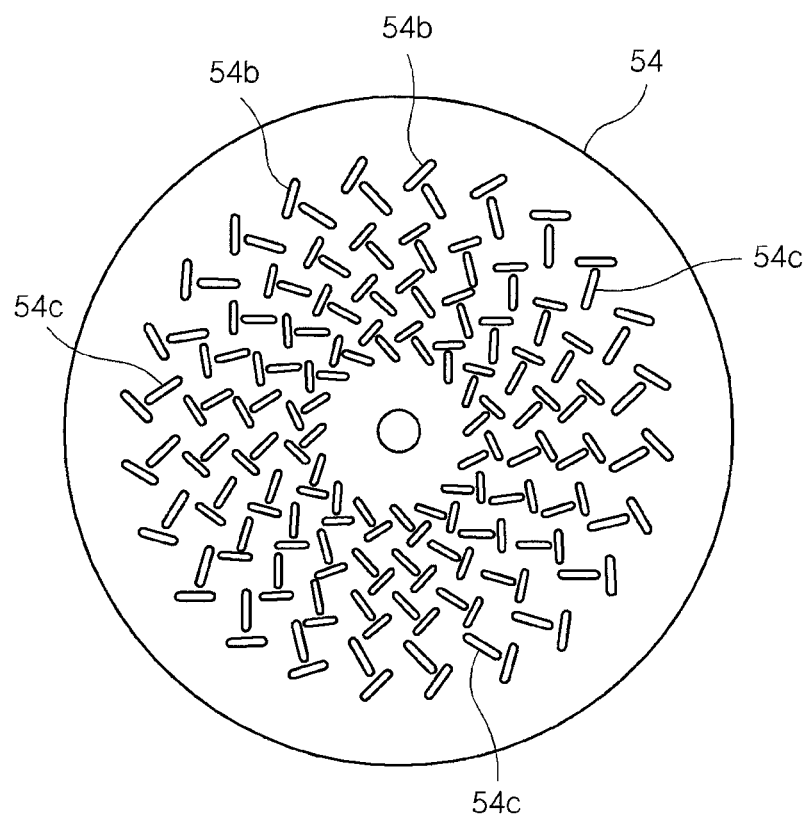
FIG. 6 is a plan view showing an example of a slot pattern of the radial line slot antenna.

FIG. 6 shows an example of a slot pattern of the slot antenna plate 54. The slot antenna plate 54 has slots 54b and 54c arranged concentrically. Specifically, two kinds of slots whose longitudinal directions are perpendicular to each other are arranged alternately in concentric circles. The radial spacing between the concentric circles is determined based on the wavelength of the microwaves propagating radially in the slot antenna plate 54. With this slot pattern, the microwaves are converted into plane waves having two polarization components orthogonal to each other, and the plane waves are radiated from the slot antenna plate 54. The slot antenna plate 54 configured in this manner is effective to radiate the microwaves uniformly into the processing chamber 10 from the entire area of the antenna, and suitable to generate a uniform stable plasma below the antenna. The slot antenna plate 54 having such a configuration is called a radial line slot antenna.

The whole and individual operations of the exhaust unit 26, the radio frequency power supply 30, the DC power supply 40, the switch 42, the microwave generator 60, the processing gas supply source 82, the chiller unit (not shown), the heat transfer gas supply unit (not shown) and the like are controlled by a controller (not shown). The controller includes, e.g., a microcomputer and the like.

In this embodiment, etching for a 300 mm wafer has been described, but it is not limited thereto. For example, various parameters such as a gas flow rate and RF bias power may be appropriately changed by conversion using the area of the wafer W or the volume of the processing chamber.

Further, the present invention may be modified or changed in various ways in consideration of the above teachings. For specific embodiments, various modifications and changes may be made within a range not departing from the scope of the present invention. For example, the etching method of the present invention does not have to be necessarily applied to double patterning, and may be widely applied to etching a silicon oxide film selectively with respect to a silicon nitride film.

What is claimed is:

1. An etching method comprising:
    loading a substrate into a processing chamber, the substrate including a silicon nitride film, polycrystalline silicon patterns formed on the silicon nitride film and a silicon oxide film formed on a surface of the silicon nitride film and top surfaces and side surfaces of the polycrystalline silicon patterns;
    introducing a processing gas containing (i) a plasma excitation gas, (ii) a carbon and fluorine containing gas consisting of a $CHF_3$ gas, and (iii) an oxygen gas into the processing chamber, wherein a flow rate ratio of the carbon and fluorine containing gas to the plasma excitation gas is 1/15 or higher and a flow rate ratio of the oxygen gas to the carbon and fluorine containing gas is 1/10 or less; and
    etching the silicon oxide film formed on the top surfaces of the polycrystalline silicon patterns and the surface of the silicon nitride film in the processing chamber by using a plasma of the processing gas in the processing chamber while depositing a protective film containing carbon and fluorine obtained by dissociation of the carbon and fluorine containing gas on the surface of the silicon nitride film exposed during etching the silicon oxide film, wherein the silicon nitride film is etched by said etching 4 nm or less in depth, wherein the plasma is generated by microwaves supplied by using a radial line slot antenna.

2. The etching method of claim 1, wherein an etching selectivity of the silicon oxide film with respect to the silicon nitride film is equal to or greater than 1.

3. The etching method of claim 1, wherein a flow rate of the plasma excitation gas is equal to or greater than 200 sccm.

4. The etching method of claim 1, further comprising removing the polycrystalline silicon patterns to produce spacers formed of the remaining silicon oxide film after said etching.

5. The etching method of claim 1, comprising applying an RF bias power for attracting ions of the plasma toward the substrate, wherein the RF bias power ranges from 70 W to 100 W.

* * * * *